United States Patent [19]
Asazawa

[11] Patent Number: 5,212,411
[45] Date of Patent: May 18, 1993

[54] FLIP-FLOP CIRCUIT HAVING CMOS HYSTERESIS INVERTER

[75] Inventor: Hiroshi Asazawa, Tokyo, Japan

[73] Assignee: NEC Corporation, Tokyo, Japan

[21] Appl. No.: 801,542

[22] Filed: Dec. 2, 1991

[30] Foreign Application Priority Data

Nov. 30, 1990 [JP] Japan .................................. 2-340107

[51] Int. Cl.$^5$ ........................ H03K 3/289; H03K 3/26
[52] U.S. Cl. ................................... 307/279; 307/290; 307/272.2; 307/481
[58] Field of Search .................. 307/290, 272.1–272.2, 307/279, 480–481, 451–452

[56] References Cited

U.S. PATENT DOCUMENTS

| | | | |
|---|---|---|---|
| 3,983,545 | 9/1970 | Cordaro ............................... | 307/279 |
| 4,003,035 | 1/1977 | Hoffmann et al. .................. | 307/279 |
| 4,837,465 | 6/1989 | Rubinstein .......................... | 307/279 |

FOREIGN PATENT DOCUMENTS 3443798  6/1986  Fed. Rep. of Germany ...... 307/279

OTHER PUBLICATIONS

Cong, Hong-Ih et al., "Multigigahertz CMOS Dual Modulus Prescalar IC", IEEE Journal of Solid State Circuits, vol. 23, No. 5, Oct. 1988, pp. 1189–1193.

Primary Examiner—William L. Sikes
Assistant Examiner—Margaret Rose Wambach

[57] ABSTRACT

A flip-flop circuit includes a hysteresis inverter, a data input terminal, a data output terminal, a clock input terminal and a transfer gate. The hysteresis inverter has a first inverter whose input and output nodes are connected respectively to the data input and output terminals, and a second inverter whose input and output node are connected respectively to the data output and input terminals. The transfer gate is connected between the data input and output terminals, and turns on and off in response to a clock signal applied to the clock input terminal, thereby changing hysteresis area or effects of the hysteresis inverter. The transfer gate causes the area of hysteresis to be variable, so that the circuit requires only a small number of gate stages, can operate at a high speed, and can operate at a low power supply voltage.

3 Claims, 4 Drawing Sheets

FLIP-FLOP CIRCUIT HAVING CMOS HYSTERESIS INVERTER

BACKGROUND OF THE INVENTION (1) Field of the Invention

The present invention relates to a high speed flip-flop circuit and, more particularly, to a flip-flop circuit having a CMOS inverter (hereinafter referred to as a "CMOS flip-flop circuit").

(2) Description of the Related Art

An example of a conventional high speed CMOS flip-flop circuit is shown in FIG. 1. The CMOS flip-flop circuit shown is a dynamic type flip-flop circuit. As shown in the drawings, complementary clock signals are inputted to clock signal input terminals 6 and 7, respectively, and when a CMOS transfer gate circuit 9 composed of a complementary pair of P-channel and N-channel transistors turns on in response to the clock signals, the data signal applied to a data input terminal 4 is latched and then inverted by an inverter 1 with the inverted signal being outputted at a data output terminal 5. Thereafter, when the transfer gate circuit 9 turns off, this state is held.

FIG. 2 shows a conventional example of a master-slave type flip-flop circuit wherein two stage flip-flop circuits each of which is the same as that shown in FIG. 1 are connected in series and wherein an output of the second stage flip-flop circuit (composed of a transfer gate circuit 19 and an inverter 11) is inverted by an inverter 21 and fed back to a transfer gate circuit 9, whereby a T-type flip-flop circuit is formed. In this T-type flip-flop circuit, when the complementary clock signals are applied to the clock signal input terminals 6 and 7, a signal whose frequency is half that of the complementary clock signal is outputted at the output terminal 5.

Another CMOS flip-flop circuit capable of operating at a high speed is shown in FIG. 3. The CMOS flip-flop circuit shown in FIG. 3 is disclosed in a publication "Multigigahertz CMOS Dual-Modulus Prescalar IC" (by H. Cong et al, in IEEE Sc. Vol. 23 No. 5, October 1988, pages 1189-1194).

In the above CMOS flip-flop circuit, the master-slave configuration is realized by use of two hysteresis inverters, one being composed of inverters 1, 2 as a first hysteresis inverter and the other being composed of inverters 11, 12 as a second hysteresis inverter. The clock input signal adopts a single-phase signal and not complementary signals. The clock signal inputted to the clock signal input terminal 6 is applied to the gates of P-channel transistors 31, 32 for the master stage and the same is applied to the gate of an N-channel transistor 35 for the slave stage. The signals inputted to the data input terminals 4, 8 are the complementary signals which are applied to the gates of N-channel transistors 33, 34 and which cause the P-channel transistors 31, 32 to function so that such complementary data signals can change the input and output potentials of the first hysteresis inverter (1, 2).

N-channel transistors 36, 37 function as a differential pair having a common source connection and control the data inputs of the slave flip-flop stage. The transistor 35 functions so that the data inputs can change the input and output potentials of the second hysteresis inverter (11, 12).

In the conventional dynamic type flip-flop circuits shown in FIGS. 1 and 2, there is no particular holding circuit for data signals, and the data is held and stored in the form of a charge to a gate capacitance of the field effect transistors constituting the inverter 1. Therefore, although the circuit can operate at a comparatively high speed, a low speed operation conversely results in loss of the charge thereby causing malfunctions to occur. Also, since the flip-flop circuits shown in FIGS. 1 and 2 are CMOS circuits, the above mentioned gate capacitance must be charged and discharged with the signals fully swinging to the power supply voltage and this has limited the realization of a circuit capable of operating at a high speed.

The master-slave flip-flop circuit shown in FIG. 3 involves the problem that the level of the single-phase clock signal to be applied to the clock signal input terminal 6 cannot be decided by a single standard since the P-channel transistors 31, 32 are used for the master flip-flop stage, and another type, that is, the N-channel transistor 35 is used for the slave flip-flop stage. This problem arises because threshold values of the P-channel transistors are established in the course of manufacture of the component transistors with no correlation being made with the threshold value of the N-channel transistor and also because such threshold values can vary in the course of manufacture. The variation thus occurring has influence on the production yield at the fabrication or integration of the device. Further, since the transistor 35 is connected in series with the differential pair transistors 36, 37, this results in a disadvantage of the realization for a low power supply voltage operation. A further disadvantage is that the number of elements required for the flip-flop circuit is large.

SUMMARY OF THE INVENTION

It is, therefore, an object of the invention to overcome the above mentioned problems existing in the conventional flip-flop circuits and to provide an improved flip-flop circuit which is capable of operating at a low power supply voltage, is capable of operating not only at a high frequency but also at a low frequency, and requires a small number of elements.

According to one aspect of the invention, there is provided a flip-flop circuit which comprises:

a data input terminal, a data output terminal and a clock signal input terminal;

a hysteresis inverter having a first inverter whose input node and output node are connected respectively to the data input terminal and to the data output terminal, and a second inverter whose input node and output node are connected respectively to the data output terminal and to the data input terminal; and a switching means which is connected between the data input terminal and the data output terminal, which turns on and off in response to a clock signal applied to the clock signal input terminal and which changes the area of hysteresis of the hysteresis inverter.

The above switching means can be realized by a transfer gate consisting of an N-channel field effect transistor or a P-channel field effect transistor. For the complementary clock signals, the switching means can be realized by a transfer gate circuit formed by a complementary pair of N-channel and P-channel field effect transistors connected in parallel with each other.

Hysteresis effects of the hysteresis inverter are sufficiently large while the switching means is switched off, so that in this state even if the data is supplied to the data input terminal, the data is not latched. On the other hand, when the switching means turns on, the hysteresis effects of the hysteresis inverter become smaller and potentials at the input and output nodes of the hysteresis inverter change in accordance with the voltage level of the data at the data input terminal, thereby causing the data to be latched according to the hysteresis curve.

BRIEF DESCRIPTION OF THE DRAWINGS

The above and other objects, features and advantages of the present invention will be apparent from the following description of preferred embodiments of the invention explained with reference to the accompanying drawings, in which.

DESCRIPTION OF THE PREFERRED EMBODIMENTS

Now, some preferred embodiments of the invention will be explained with reference to the accompanying drawings.

It should be noted that, throughout the following explanation, similar reference symbols or numerals refer to the same or similar elements in all the figures of the drawings.

Figure 5:
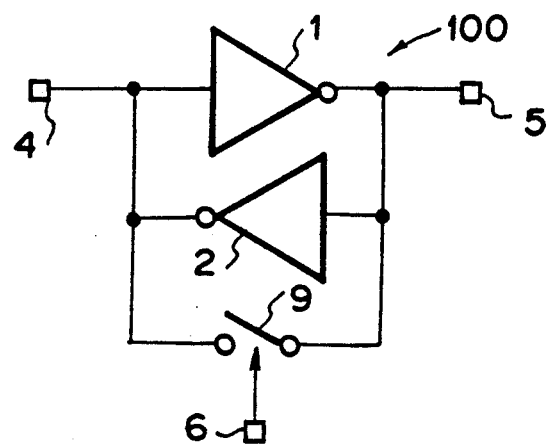
FIG. 5 is a circuit diagram showing a flip-flop circuit of a first embodiment according to the invention.

FIG. 5 diagrammatically shows a flip-flop circuit of a first embodiment according to the present invention.

In FIG. 5, the numerals 1 and 2 denote the inverters constituting a hysteresis inverter 100, the numeral 4 denotes a data input terminal of a flip-flop circuit, and the numeral 5 denotes a data output terminal for outputting an inverted data signal. Between the input and output terminals 4 and 5 of the hysteresis inverter 100, there is provided a switching means 9 which turns on and off in response to a clock signal supplied to a clock signal input terminal 6.

The hysteresis area of the hysteresis inverter 100 is set such that, while the switching means 9 is in its off state, the state of the hysteresis inverter 100 may not be inverted even if an output from another CMOS circuit is applied to the data input terminal 4. Such setting can be achieved through the selection of, for example, gate lengths and/or widths of the field effect transistors constituting the inverters 1, 2.

The on-resistance of the switching means 9 is set sufficiently low such that, when the switching means 9 is on, the amount or area of the hysteresis becomes small and the data signal at the data input terminal 4 may be latched.

When the output of the hysteresis inverter 100 is inverted while switching means 9 is switched off, the output of the inverter 2 will not change to the level of the power supply potential or to the level of the ground potential but will change slightly either towards the level of the power supply voltage or towards the ground potential by the level of the threshold voltage because a voltage level of the data input terminal inverter 2 are opposite to each other 4 and an output voltage level of the inverter 2 are opposite to each other. The same is true for the output voltage level in the inverter 1 and the next switching on of the switching means 9 results in a precharge for the inversion of the voltage in the data output terminal 5, thereby enabling to realize a high speed operation.

Figure 6:
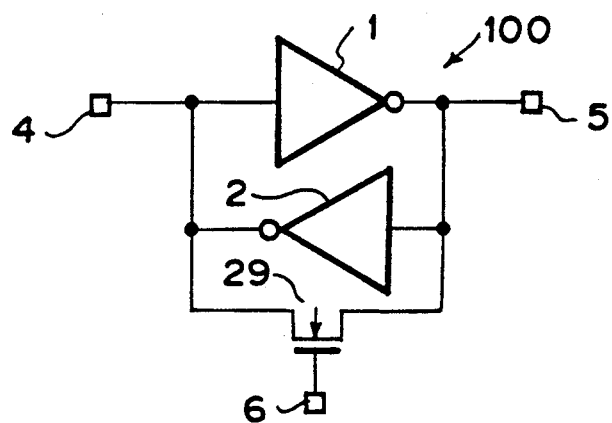
FIG. 6 is a circuit diagram showing a flip-flop circuit of a second embodiment according to the invention.

Next, FIG. 6 is a circuit diagram showing a flip-flop circuit of a second embodiment according to the invention in which the feature resides in the use of an N-channel transfer gate 29 in place of the switching means 9 of the first embodiment shown in FIG. 5. The explanation on the circuit operation is omitted here as it is the same as that for the first embodiment.

Figure 7:
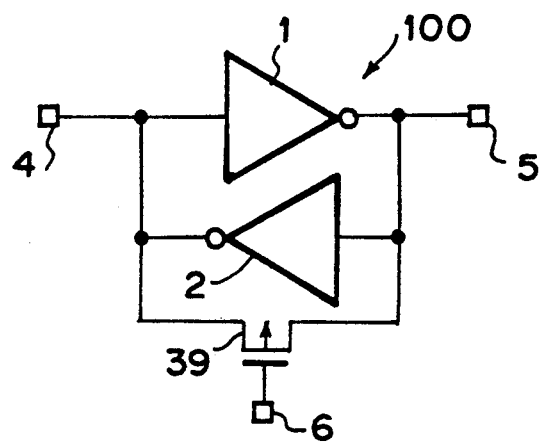
FIG. 7 is a circuit diagram showing a flip-flop circuit of a third embodiment according to the invention.

FIG. 7 is a circuit diagram showing a flip-flop circuit of a third embodiment according to the invention, which is featured in the use of a P-channel transfer gate 39 as the switching means 9 shown in FIG. 5. The explanation on the arrangements and circuit operation is omitted here as it is the same as that for the first embodiment.

Figure 8:
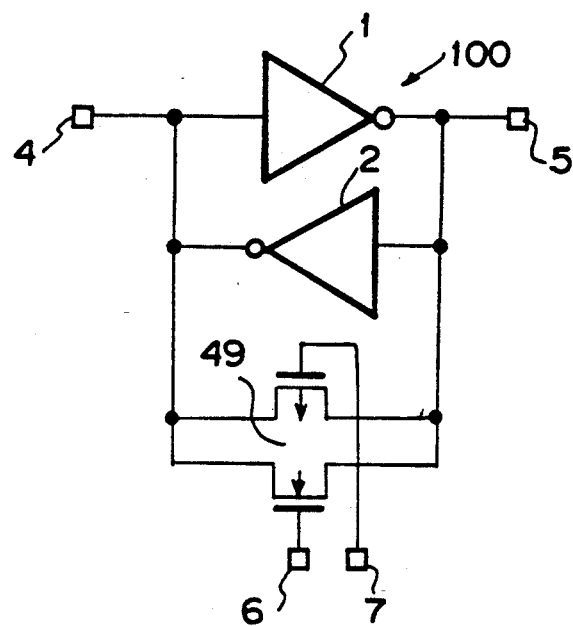
FIG. 8 is a circuit diagram showing a flip-flop circuit of a fourth embodiment according to the invention.

FIG. 8 is a circuit diagram showing a flip-flop circuit of a fourth embodiment according to the invention, the feature of which resides in the realization of the switching means 9 shown in FIG. 5 by the CMOS transfer gate circuit 49 which is composed of a complementary pair of N-channel and P-channel transistors connected in parallel. The explanation on the remaining arrangements and circuit operation is omitted as it is the same as that for the first embodiment except that the CMOS transfer gate circuit 49 receives complementary clock signals applied to the clock signal input terminals 6 and 7 and it turns on and off in response to these signals.

Figure 10:
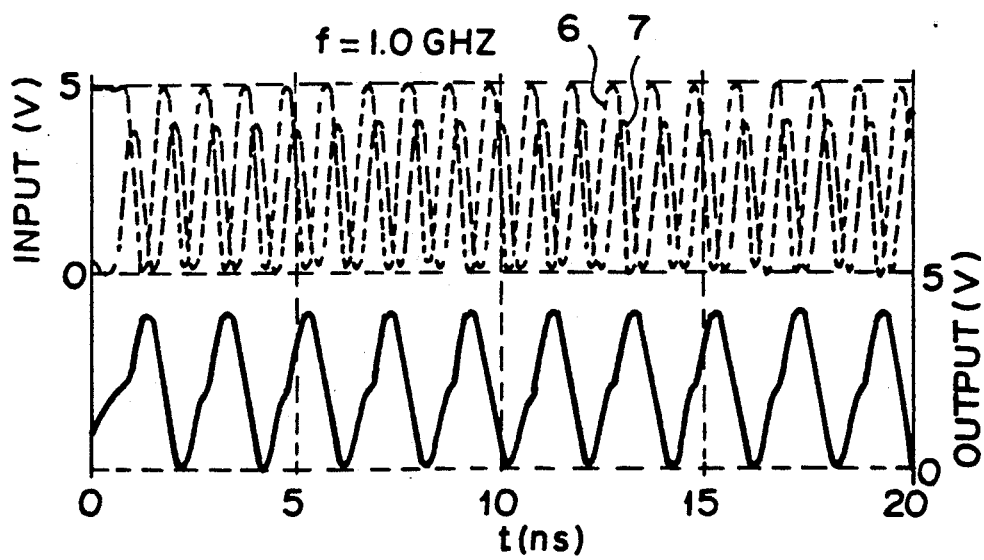
FIG. 10 is a diagram showing operation waveforms of the fifth embodiment shown in FIG. 9, according to the invention.
Figure 9:
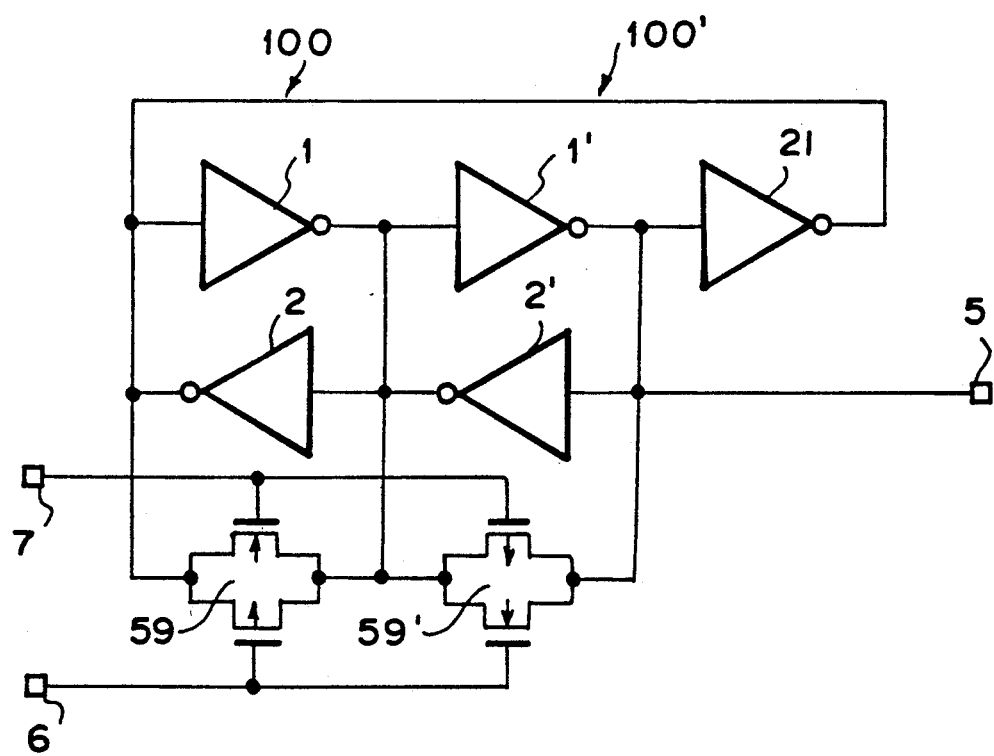
FIG. 9 is a circuit diagram showing a master-slave T-type flip-flop circuit of a fifth embodiment according to the invention.

FIG. 9 is a circuit diagram of a master-slave T-type flip-flop circuit as a fifth embodiment according to the invention, whose typical operation waveforms are shown in FIG. 10. The waveforms in FIG. 10 show that the circuit is capable of operating up to 1 GHz of the input signal frequency. The master-slave T-type flip-flop circuit shown in FIG. 9 comprises two stages of hysteresis inverters 100, 100', the first and second stages being composed of the inverters 1, 2 and 1', 2' and the complementary transfer gate circuits 59, 59', respectively, shown in FIG. 8. Each of the complementary transfer gate circuits 59, 59' receives complementary clock signals applied to the clock, signal input terminals 5 and 7. The output of the second stage hysteresis inverter 100' and the input of the first stage hysteresis inverter 100 are connected through an inverter 21.

Figure 1:
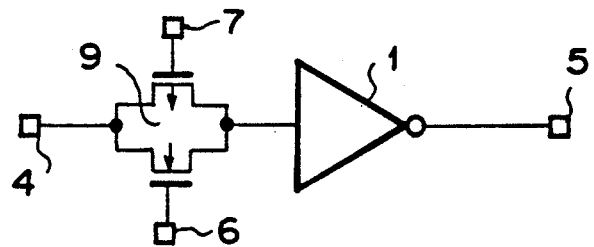
FIG. 1 is a circuit diagram showing a conventional flip-flop circuit.
Figure 2:
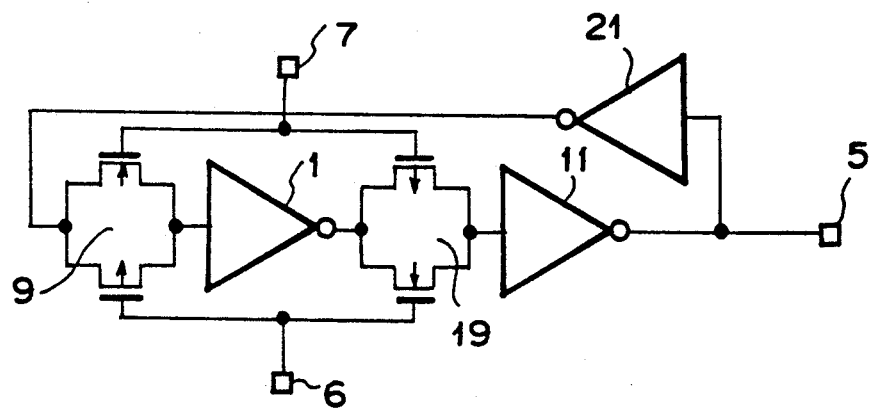
FIG. 2 is a circuit diagram showing a conventional master-slave T-type flip-flop circuit.
Figure 3:
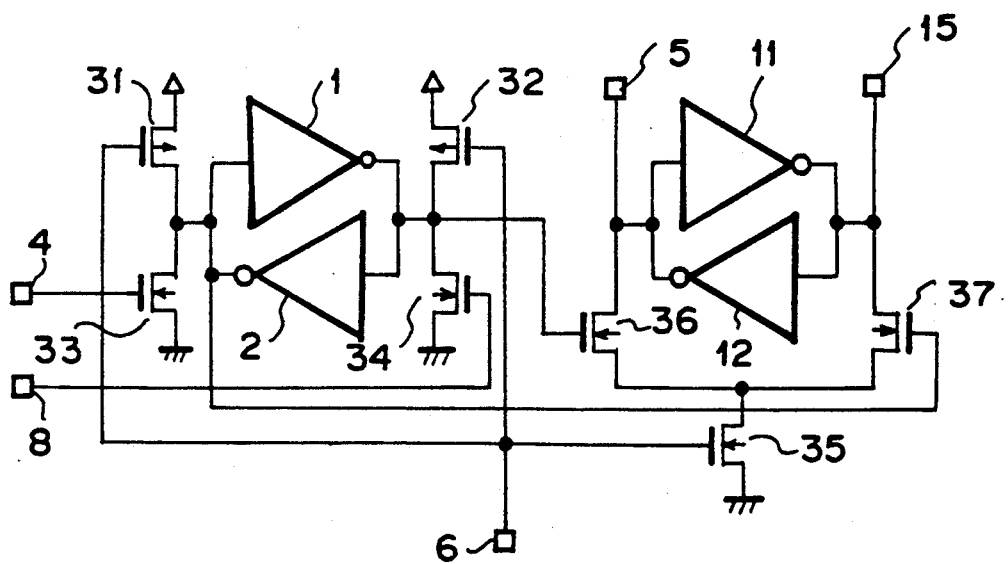
FIG. 3 is a circuit diagram showing a conventional master-slave flip-flop circuit.
Figure 4:
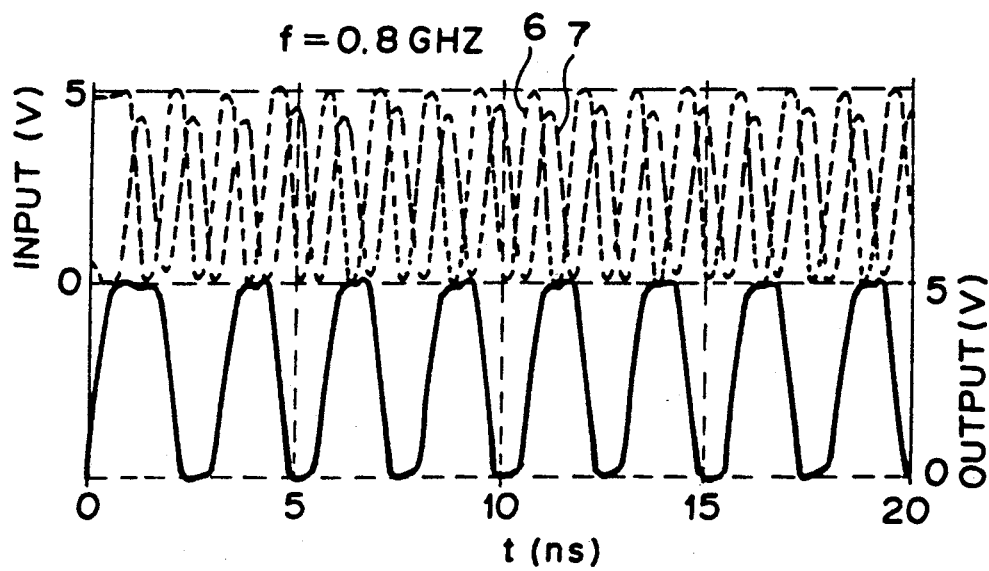
FIG. 4 is a diagram showing operation waveforms of a conventional T-type flip-flop circuit shown in FIG. 2.

FIG. 4 is a diagram of the operation waveforms in the conventional dynamic T-type flip-flop circuit shown in FIG. 2. For the purpose of comparison, it is assumed that a transistor size and other conditions in the conventional example are the same as those of the fifth embodiment shown in FIG. 9. Despite being a dynamic circuit, the waveforms show that the conventional circuit can operate only up to 0.8 GHz of the input signal frequency, and this is due to the output being in a full-swing between the ground potential and the power supply potential.

As explained above, according to the invention, the data are not lost even when the circuit operates at a low frequency since they are memorized in the hysteresis inverter. Since the switching means is provided between the input and output nodes of the hysteresis inverter for causing the area of hysteresis to be variable, the circuit requires only a small number of gate stages and also since the area of hysteresis reduced by the data need only be inverted, the data are not required to be in full-swing and this enables the circuit to operate at a high speed.

Further, since the operation point is decided by a size ration between the N-channel transistor and the P-channel transistor of the inverters 1, 2 constituting the hysteresis inverter and the control of the amount or area of the hysteresis is decided by the size of the switching means, the circuit has a strong stability against the variation which may develop in the course of manufacture and requires also only a small number of elements, all of which are suited to the advancement of large scale integration (LSI) circuits.

Even in the case where the flip-flop circuit according to the invention is used for dealing with a high speed operation and a single slowed down is interfaced with an ordinary CMOS circuit, the circuit according to the invention can be operatively connected directly to the CMOS circuit concerned.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A master-slave T-type flip-flop circuit comprising:
 a master stage flip-flop circuit including a master stage hysteresis inverter and a master stage complementary transfer gate circuit connected between input and output nodes of said master stage flip-flop circuit, said master stage complementary transfer gate circuit receiving complementary clock signals;
 a slave stage flip-flop circuit directly connected in series with said master stage flip-flop circuit and including a slave stage hysteresis inverter and a slave stage complementary transfer gate circuit connected between input and output nodes of said slave stage flip-flop circuit, said slave stage complementary transfer gate circuit receiving said complementary clock signals;
 an output terminal, said output node of said slave stage flip-flop circuit being connected to said output terminal; and
 a feedback inverter interconnected between the output node of said slave stage flip-flop circuit and the input node of said master stage flip-flop circuit.

2. A master-slave T-type flip-flop circuit according to claim 1, wherein said master stage hysteresis inverter includes a first inverter having input and output which are connected respectively to the input and output nodes of said master stage flip-flop circuit, and a second inverter having input and output which are connected respectively to the output and input nodes of said master stage flip-flop circuit, and said slave stage hysteresis inverter including a third inverter having input and output which are connected respectively to the input and output nodes of said slave stage flip-flop circuit and a fourth inverter having input and output which are connected respectively to the output an input nodes of said slave stage flip-flop circuit.

3. A master slave T-type flip-flop circuit according to claim 1, wherein each of said master and slave stage complementary transfer gate circuits includes an N-channel field effect transistor and a P-channel field effect transistor connected in parallel with each other.

* * * * *